US009341647B2

(12) United States Patent
Lin et al.

(10) Patent No.: US 9,341,647 B2
(45) Date of Patent: May 17, 2016

(54) TESTING APPARATUS AND METHOD

(75) Inventors: Chun-Hsun Lin, Taichung (TW);
Hsuan-Hao Yang, Taichung (TW);
Tzu-Yuan Huang, Taichung (TW);
Kuang-Ching Fan, Taichung (TW);
Hsin-Hung Lee, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 700 days.

(21) Appl. No.: 13/588,086

(22) Filed: Aug. 17, 2012

(65) Prior Publication Data

US 2013/0328584 A1    Dec. 12, 2013

(30) Foreign Application Priority Data

Jun. 7, 2012    (TW) .............................. 101120432 A

(51) Int. Cl.
*G01R 31/00*    (2006.01)
*G01R 1/04*    (2006.01)
*G01R 31/28*    (2006.01)

(52) U.S. Cl.
CPC .......... *G01R 1/0408* (2013.01); *G01R 31/2831* (2013.01); *G01R 31/2886* (2013.01)

(58) Field of Classification Search
CPC ..................... G01R 31/31716; G01R 31/0408; G01R 31/2894; G01V 1/183
USPC .......................... 324/750.16–750.22, 519, 523, 324/762.09–764.01
See application file for complete search history.

(56) References Cited

U.S. PATENT DOCUMENTS 6,636,366 B1 * 10/2003 Itonaga .......................... 359/719

* cited by examiner

*Primary Examiner* — Melissa Koval
*Assistant Examiner* — Trung Nguyen
(74) *Attorney, Agent, or Firm* — Mintz Levin Cohn Ferris Glovsky and Popeo, P.C.; Peter F. Corless; Steven M. Jensen

(57) ABSTRACT

Disclosed is a testing apparatus, including: a base having opposite upper and lower surfaces, and a plurality of electrical circuits formed in the base, each of the electrical circuits extending from the upper surface to the lower surface and bending backwards to the upper surface such that two terminal ends of the electrical circuit are located on the upper surface. While in a testing, an element is disposed on the upper surface of the base such that testing probes are placed on the electrical contact spots of both the element and the upper surface of the base, thus without resorting to double sided testing that testing probes are placed on the upper and lower surfaces of the element as mentioned in the prior art. Hence, the testing apparatus and testing method can simplify the testing process and prevent the element from damage caused by mechanical stresses of the testing probes.

18 Claims, 6 Drawing Sheets

TESTING APPARATUS AND METHOD

CROSS-REFERENCES TO RELATED APPLICATIONS

This application claims under 35 U.S.C. §119 (a) the benefit of Taiwanese Application No. 101120432, filed Jun. 7, 2012, the entire contents of which is incorporated herein by reference.

BACKGROUND OF THE INVENTION

1. Field of the Invention

The present invention relates to testing apparatus and methods, and, more particularly, to an apparatus and method for testing stacked integrated circuit (IC) packaging structures.

2. Description of Related Art

3D IC chip stacking packaging technologies have been developed for integrating more electronic elements and functions in a limited area to meet the requirements of multifunction and miniaturization as demanded by electronic products.

3D IC chip stacking packaging technologies involve stacking and integrating a plurality of chips having different functions, characteristics or substrates through through-silicon via (TSV) technology, which is also referred to as 2.5D IC technology, on the other hand, the current 3D IC technologies individually make these different functional chips by the most appropriate fabrication processes and then integrate the chips with TSVs, to thereby shorten signal transmission distance and reduce conductive resistance and chip size. Therefore, the advantages of package scaling, high integration, high efficiency, low power consumption, and low cost can be realized to meet the miniaturization requirement of digital electronics.

To test a 3D IC (or 2.5D IC) chip structure, especially semiconductor elements having TSVs, is critical for mass production. Testing a semiconductor element generally includes a chip probe (CP) test before a packaging process and a final test (FT) after the packaging process.

FIGS. 1A and 1B illustrate a chip probe test performed on an element 7. The element 7 to be tested is a wafer substrate 9 having TSVs 90 formed therein and chips 8 bonded thereon. The element 7 is disposed on a testing apparatus 1. The testing apparatus 1 has a base 10 and a lid 11. The element 7 contacts both the base 10 and the lid 11 through compression pressure such that pogo pins 110 of the lid 11 are in electrical connection with electrical contacts 91 on an upper side of the wafer substrate 9 to form an electrical circuit loop L1, and electrical circuits 100 and conductive bumps 101 of the base 10 are in electrical connection with electrical contacts 92 on a lower side of the wafer substrate 9 to form an electrical circuit loop L2, thereby enabling a double-side (upper and lower sides) probe test.

However, since a wafer substrate 9 with TSVs is 10 μm to 180 μm thick only, the wafer substrate 9 is easy to crack when the pogo pins 110 come into contact with the wafer substrate 9 downwards. The contact pressure in fact easily do damage to the wafer substrate 9.

Furthermore, the double-side electrical circuit loops L1, L2 complicate the electrical circuit layout. The structure only enables to perform a CP test before the packaging process and does not do an FT test after the packaging process. Therefore, the present technology cannot have a testing apparatus that provides both CP and FT tests for an element having TSVs to be tested.

In addition, the contact pressure can cause inaccurate alignment in the electrical circuit loops L1, L2.

Therefore, it is dispensable that there is a need to invent a testing apparatus and method to overcome the above-described disadvantage.

SUMMARY OF THE INVENTION

In view of the above-described disadvantage, the present invention provides a 3D IC wafer level testing apparatus that allows testing probes to be disposed on a single side of both the element to be tested and the base of testing apparatus, thereby eliminating the need to dispose testing probes on both sides of the element to be tested as described in the prior art to simplify the testing process and electrical circuit design. Furthermore, the testing apparatus is capable of testing ultra-thin dies having TSVs.

Accordingly, the present invention provides a testing apparatus, which comprises: at least a base having opposite first and second surfaces; and a plurality of electrical circuits formed in the base, each of the electrical circuits extending from the first surface to the second surface and bending backwards to the first surface such that two terminal ends of each of the electrical circuits are located on the first surface.

The present invention further states a testing method, which comprises: providing a testing apparatus comprising at least a base and a plurality of electrical circuits formed in the base, wherein the base has opposite first and second surfaces and each of the electrical circuits extends from the first surface to the second surface and bends backwards to the first surface such that two terminal ends of each of the electrical circuits are located on the first surface; and disposing at least an element to be tested on the base and electrically connecting the element and the electrical circuits for performing a test.

In the above-described apparatus and method, a testing placement area can be formed on the first surface of the base for the element to be tested to be placed thereon, and one of the two terminal ends of each of the electrical circuits is located inside the testing placement area and the other one is located at an outer periphery of the testing placement area.

In the above-described apparatus and method, a recess can be formed on the first surface of the base for loading the element to be tested. The recess can be formed with chamfers along upper corner edges thereof for disposing the element to be tested in the recess.

In the above-described apparatus and method, an elastic part can be formed on the first surface of the base for holding the element to be tested.

In the above-described apparatus and method, a positioning structure can be formed on the first surface of the base for positioning the element to be tested. The positioning structure can be a through hole in communication with the first and second surfaces. The testing apparatus can further comprise a vacuum system in communication with the through hole for fixing the element to be tested by vacuum suction.

In the above-described apparatus and method, the two terminal ends of each of the electrical circuits can serve as electrical testing contact spots.

According to the present invention, the electrical circuit layout of the testing apparatus allows an ultra-thin chip to be tested by a single-side electrical test, thereby simplifying the testing process and enabling both CP and FT tests to be performed.

Further, the elastic part, the through hole and the vacuum system can help prevent the element to be tested from damage.

Furthermore, the chamfers of the recess and the vacuum structure enable the element to be tested to be accurately positioned on the base without any deviation.

DETAILED DESCRIPTION OF PREFERRED EMBODIMENTS

The following illustrative embodiments are provided to illustrate the disclosure of the present invention, these and other advantages and effects can be apparent to those with ordinary skill in the art after reading this specification.

It should be noted that all the drawings are not intended to limit the present invention. Various modification and variations can be made without departing from the spirit of the present invention. Further, terms such as "upper", "lower", "first", "second", "a" etc. are merely for illustrative purpose and should not be construed to limit the scope of the present invention.

Figure 1A:
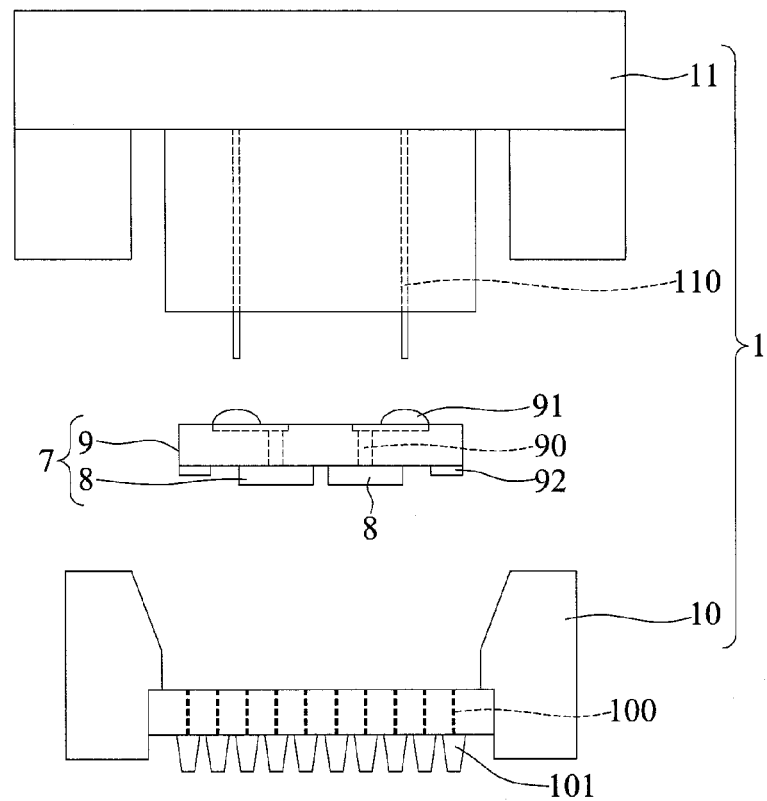
FIGS. 1A and 1B are cross sectional side views illustrating a conventional testing apparatus and method.
Figure 1B:
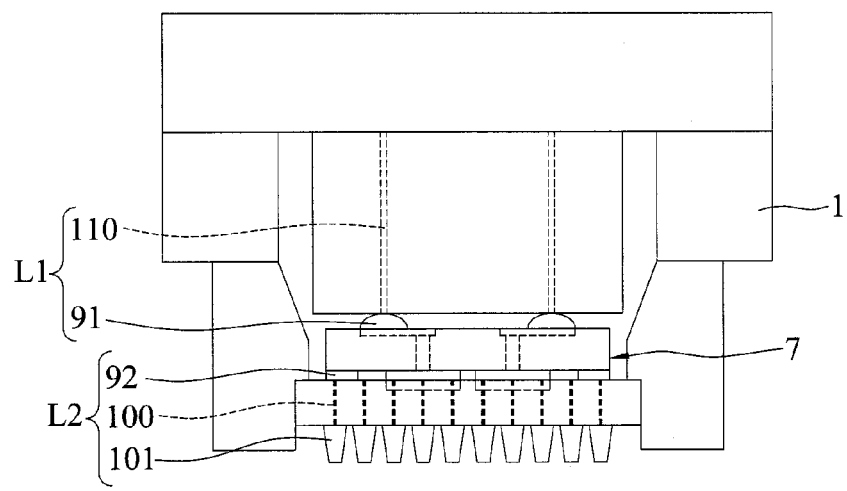
Figure 2:
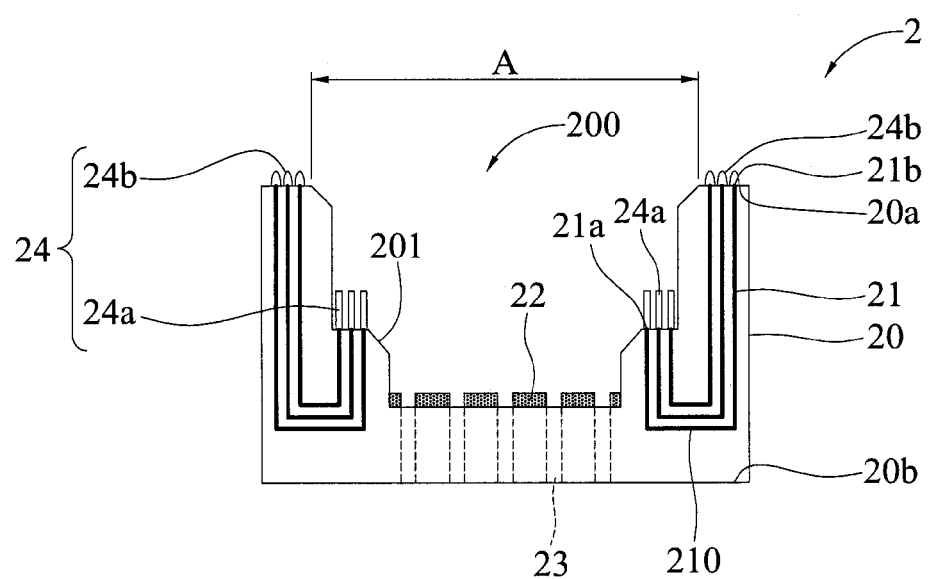
FIG. 2 is a cross sectional side view illustrating a testing apparatus according to a first embodiment of the present invention.

FIG. 2 is a cross sectional side view of a testing apparatus 2 according to a first embodiment of the present invention. Referring to FIG. 2, the testing apparatus 2 has a base 20 and a plurality of electrical circuits 21 formed on surfaces of the base 20.

The base 20 has a first surface 20a and a second surface 20b opposite to the first surface 20a, and a testing placement area A is formed on the first surface 20a of the base 20. In an embodiment, the testing placement area A has a recess 200. The recess 20 is formed with chamfers 201 along upper corner edges thereof.

In an embodiment, an elastic part 22 and a positioning structure are formed on a bottom surface of the recess 200. The elastic part 22 can be made of, but not limited to, rubber or latex. The positioning structure is a plurality of through holes 23 in communication with the first and second surfaces 20a and 20b. The testing apparatus 2 further has a vacuum system (not shown) in communication with the through holes 23 for fixing an element to be tested in the recess 200 by vacuum suction. But it should be noted that the fixing structure and method for fixing the element to be tested are not limited thereto.

The base 20 can be formed by molding or stamping. According to the electrical test requirement of the element to be tested, the base 20 can be made of Vespel (Dupont), PEEK, PBI, Kapton (Dupont), PTFE, POM, Nylon and so on. Then, the recess 200 can be formed by mechanical processing or etching. The through holes 23 can be formed by mechanical drilling before the elastic part 22 is attached to the bottom surface of the recess 200.

Each of the electrical circuits 21 extends from the first surface 20a to the second surface 20b and bends backwards to the first surface 20a such that two terminal ends (a first end 21a and a second end 21b) of the electrical circuit 21 are located on the first surface 20a.

In an embodiment, each of the electrical circuits 21 forms a J-shape in side view. In other embodiments, each of the electrical circuits 21 can have a U-shape, an arc shape or the like.

The electrical circuits 21 can be formed by directly attaching copper foils, copper pillars or other conductive materials on a side surface of the base 20. Alternatively, a thermosetting resin can serve as an insulating substrate (not shown) such that a liquid insulating material is formed on the substrate by coating and a plurality of layers of conductive traces are formed on the insulating substrate through laser drilling and electroless plating processes to thereby form the electrical circuits 21. Then, the insulating substrate with the electrical circuits 21 is attached to the side surface of the base 20. The insulating substrate can be a printed circuit board, a silicon wafer, a glass wafer or PEI.

In other embodiments, the electrical circuits 21 can be embedded in the base 20. It should be noted that there is no special limitation on the method for forming the electrical circuits 21, as long as each of the electrical circuits 21 has two terminal ends located on the first surface 20a.

The first end 21a and the second end 21b of each of the electrical circuits 21 serve as electrical testing contacts. The first ends 21a are located inside the recess 200 and the second ends 21b are located at an outer periphery of the recess 200. Further, conductive elements 24 such as conductive bumps 24b or pins 24a are formed on the first ends 24a and the second ends 24b, respectively.

Figure 3A:
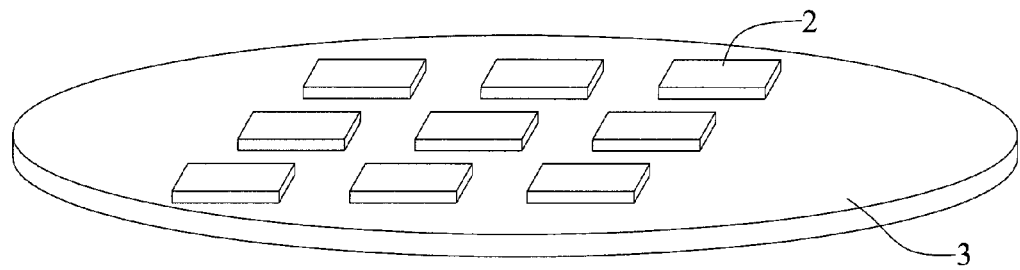
FIGS. 3A to 3C are views illustrating a testing apparatus and method according to the first embodiment of the present invention.
Figure 3B:
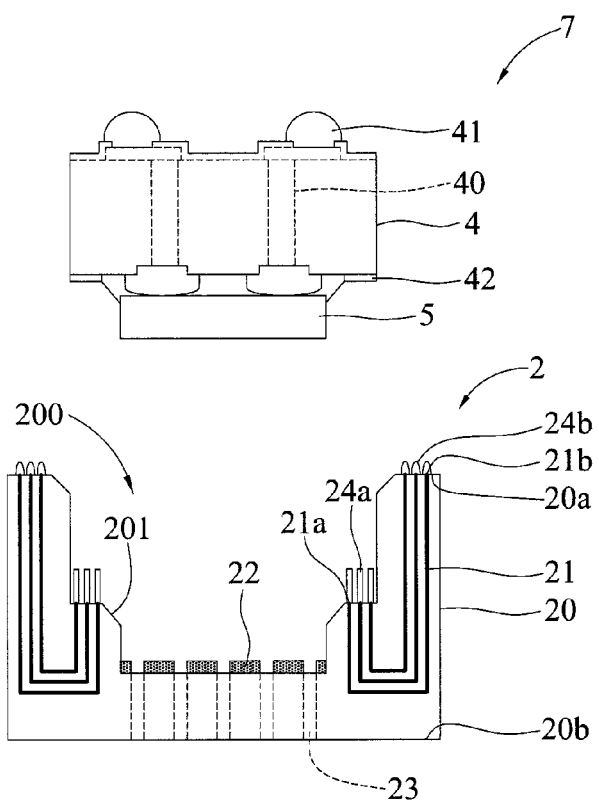
Figure 3C:
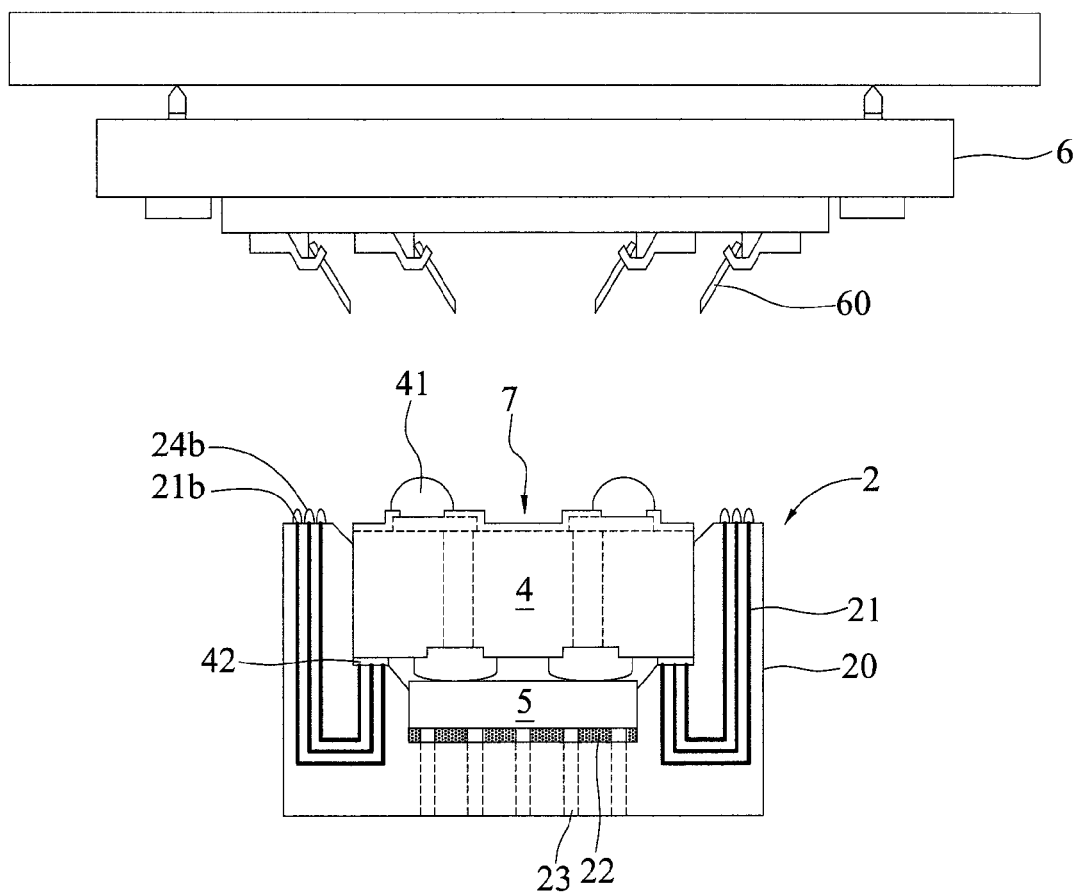

FIGS. 3A and 3C illustrate a testing method using the testing apparatus 2.

Referring to FIG. 3A, a plurality of testing apparatuses 2 are disposed on a carrier 3. Although nine testing apparatuses are shown in the drawing, it should be noted that the number of the testing apparatuses 2 can vary according to the size of dies and other requirements. For example, the number of the testing apparatuses 2 ranges from 4 to 9,192.

In an embodiment, the carrier 3 corresponds in shape and size to an 8-inch, 12-inch or 18-inch wafer, and can be directly loaded into a general wafer prober (not shown) or a film frame probing handler (not shown) after singulation. Further, the carrier 3 can be loaded to a die pick-and-place machine to automatically place elements to be tested in the testing apparatus 2.

Referring to FIG. 3B, an element 7 to be tested is fixed on the bottom surface of the recess 200 of the base 20 by vacuum suction and electrically connected to the first ends 21a of the electrical circuits 21 (i.e., the conductive pins 24a).

In an embodiment, the element 7 to be tested can be a 2.5D IC, a 3D IC or other electronic element to be tested and have a die size or a wafer size. For example, the element 7 to be tested includes a wafer substrate 4, i.e., an interposer having silicon vias 40 and a plurality of chips 5 bonded thereto. The wafer substrate 4 has a plurality of electrical contacts 41 and 42 formed on upper and lower sides thereof, and the electrical contacts 42 on the lower sides of the wafer substrate 4 electrically connect the first ends 21a of the electrical circuits 21 (i.e., the conductive pins 24a). The chips 5 can be application specific integrated circuit (ASIC) chips or dynamic random-access memory (DRAM) chips.

The chamfers 201 of the recess 200 can slide the element 7 to be tested to align with the base 20.

The elastic part 22 prevents the element 7 to be tested from collision damage between the base 20 and the element 7 to be tested.

Further, by the through holes 23 and the vacuum system, the element 7 to be tested can be fixed on the base 20 without any deviation. Also, the element 7 can be conveniently picked and placed.

Referring to FIG. 3C, after the element 7 to be tested is accurately fixed to the testing apparatus 2, the vertical displacement of a wafer prober is accurately controlled to ensure a certain contact pressure between the element 7 to be tested, the testing apparatus 2 and a wafer tester 6 of the wafer prober. As such, testing probes 60 of the wafer tester 6 are in electrical connection with the electrical contacts 41 on the upper side of the wafer substrate 4 and the second ends 21b of the electrical circuits 21 (i.e., the conductive bumps 24b) for transmitting and receiving electrical signals of the element 7 to be tested.

According to the present invention, although the testing probes 60 are only disposed on the first surface 20a of the base 20, the layout of the electrical circuits 21 allows the testing probes 60 to test the electrical contacts 41 and 42 on both the upper and lower sides of the wafer substrate 4, thus eliminating the need to dispose testing probes on the second surface 20b of the base 20 or the first ends 21a of the electrical circuits 21. As such, the present invention can be used to test ultra-thin dies. Further, the testing process is effectively simplified.

Figure 4A:
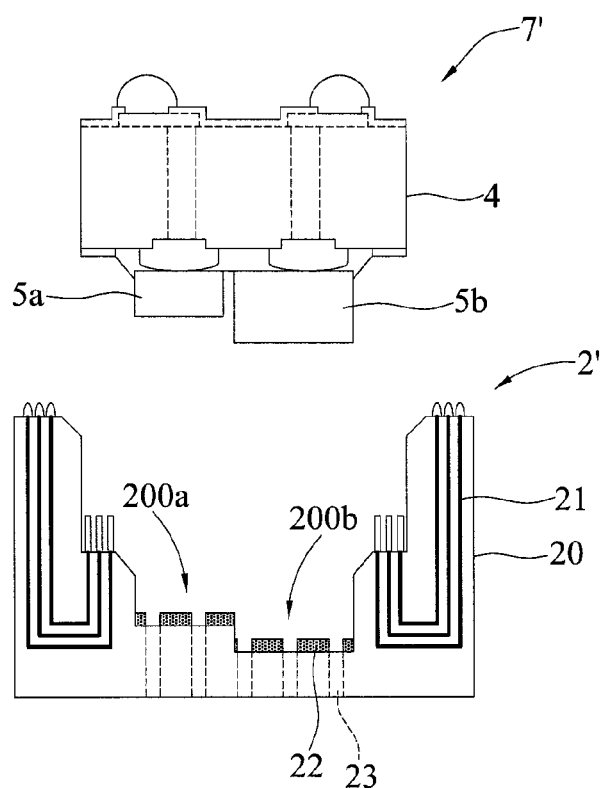
FIGS. 4A and 4B are cross sectional side views illustrating a testing apparatus and method according to a second embodiment of the present invention.
Figure 4B:
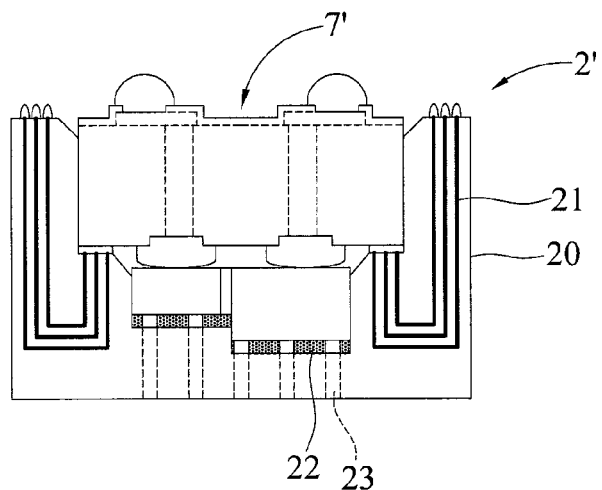

FIGS. 4A and 4B illustrate a testing apparatus 2' according to a second embodiment of the present invention. The second embodiment differs from the first embodiment in the structure of the recess.

If an element 7' to be tested has a non-planar surface and an asymmetric structure, that is, a plurality of chips 5a and 5b bonded to a wafer substrate 4 having different heights, the first surface 20a of the base 20 can be formed with recesses 200a and 200b having different heights corresponding to the chips 5a and 5b.

Figure 5A:
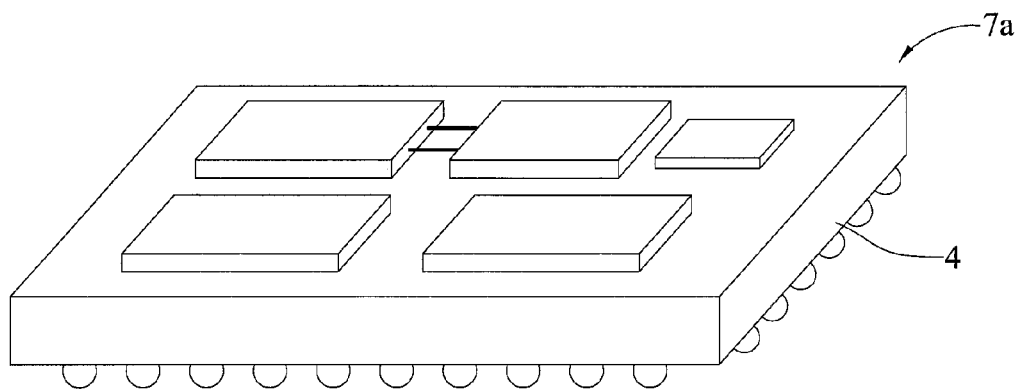
FIG. 5A is a schematic perspective view illustrating an embodiment of the element to be tested according to the present invention.
Figure 5B:
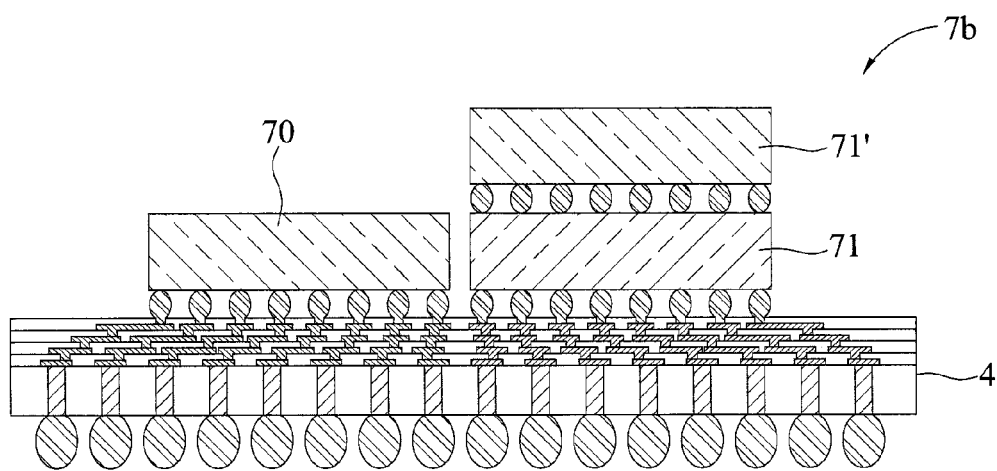
FIG. 5B is a cross-sectional view illustrating another embodiment of the element to be tested according to the present invention.

Referring to FIGS. 5A and 5B, the testing apparatus and method of the present invention can be used to test various kinds of elements 7a and 7b. Referring to FIG. 5A, the element 7a to be tested includes a wafer substrate 4 and a plurality of logic chips, RF chips, memory chips, digital or analog chips and so on disposed on the wafer substrate 4. Alternatively, referring to FIG. 5B, the element 7b to be tested includes a wafer substrate 4, at least a chip 70 and a plurality of stacked memory chips 71 and 71' disposed on the wafer substrate 4.

To test the element 7b, the testing apparatus 2 of the first embodiment can be used before the memory chip 71' is stacked on the memory chip 71 to perform a planar test. If it is determined that the element functions normally, the memory chip 71' is stacked on the memory chip 71 and the testing apparatus 2' of the second embodiment is used to perform a non-planar test to easily determine the yield of the chips 71' and 71.

Therefore, the electrical circuit layout of the testing apparatus of the present invention allows an ultra-thin chip to be tested by a single-side electrical test, thereby simplifying the testing process.

In summary, the elastic part, the through holes and the vacuum system help prevent the element to be tested from damage as a result of a testing.

Furthermore, the chamfers of the recess enable the element to be tested to be accurately positioned on the base.

The above descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A testing apparatus, comprising:
    at least a base having opposite first and second surfaces; and
    a plurality of electrical circuits formed in the base, each of the electrical circuits extending from the first surface to the second surface and bending backwards to the first surface such that two terminal ends of each of the electrical circuits are located on the first surface to perform an electrical test for an element to be tested, wherein the two terminal ends of each of the electrical circuits serve as electrical testing contact spots.

2. The testing apparatus of claim 1, further comprising a testing placement area formed on the first surface of the base for the element to be tested to be placed thereon.

3. The testing apparatus of claim 2, wherein one of the two terminal ends of each of the electrical circuits is located inside the testing placement area and the other is located at an outer periphery of the testing placement area.

4. The testing apparatus of claim 1, further comprising a recess formed on the first surface of the base for loading the element to be tested.

5. The testing apparatus of claim 4, wherein the recess is formed with chamfers along upper corner edges thereof.

6. The testing apparatus of claim 1, further comprising an elastic part formed on the first surface of the base for holding the element to be tested.

7. The testing apparatus of claim 1, further comprising a positioning structure formed on the first surface of the base for positioning the element to be tested on the base.

8. The testing apparatus of claim 7, wherein the positioning structure is a through hole in communication with the first and second surfaces.

9. The testing apparatus of claim 8, further comprising a vacuum system in communication with the through hole for fixing the element to be tested by means of vacuum suction.

10. A testing method, comprising:
    providing a testing apparatus comprising at least a base and a plurality of electrical circuits formed in the base, wherein the base has opposite first and second surfaces and each of the electrical circuits extends from the first surface to the second surface and bends backwards to the first surface such that two terminal ends of each of the electrical circuits are located on the first surface, wherein the two terminal ends of each of the electrical circuits serve as electrical testing contact spots; and
    disposing at least an element to be tested on the base and electrically coupling the element to be tested with the electrical testing contact spots of the electrical circuits to perform an electrical test.

11. The testing method of claim 10, further comprising forming on the first surface of the base a testing placement area for the element to be tested to be placed thereon.

12. The testing method of claim 11, wherein one of the two terminal ends of each of the electrical circuits is located inside the testing placement area and the other is located at an outer periphery of the testing placement area.

13. The testing method of claim 10, further comprising forming a recess on the first surface of the base for loading the element to be tested.

14. The testing method of claim 13, wherein the recess is formed with chamfers along upper corner edges thereof.

15. The testing method of claim 10, further comprising forming an elastic part on the first surface of the base for holding the element to be tested.

16. The testing method of claim 10, further comprising forming a positioning structure on the first surface of the base for positioning the element to be tested.

17. The testing method of claim 16, wherein the positioning structure is a through hole in communication with the first and second surfaces.

18. The testing method of claim 17, further comprising providing a vacuum system in communication with the through hole for fixing the element to be tested by means of vacuum suction.

* * * * *